US007749425B2

(12) United States Patent
Malenfant et al.

(10) Patent No.: US 7,749,425 B2
(45) Date of Patent: Jul. 6, 2010

(54) NANOSCALE CERAMIC COMPOSITES AND METHODS OF MAKING

(75) Inventors: Patrick Roland Lucien Malenfant, Clifton Park, NY (US); Julin Wan, Schenectady, NY (US); Mohan Manoharan, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 98 days.

(21) Appl. No.: 11/316,091

(22) Filed: Dec. 21, 2005

(65) Prior Publication Data

US 2007/0142203 A1 Jun. 21, 2007

(51) Int. Cl.
*C04B 35/64* (2006.01)
*C04B 35/56* (2006.01)
*C04B 35/571* (2006.01)
*C04B 35/577* (2006.01)

(52) U.S. Cl. .................. 264/642; 264/44; 264/340; 264/343; 264/29.1; 525/88; 501/87; 501/88; 501/92; 501/97.1; 501/97.4; 501/96.4; 501/96.2

(58) Field of Classification Search .............. 264/291, 264/44, 340, 343, 642, 643; 525/88; 501/87, 501/88, 92, 97.1, 97.4, 96.2, 96.4
See application file for complete search history.

(56) References Cited

U.S. PATENT DOCUMENTS

| | | | | |
|---|---|---|---|---|
| 5,344,907 A | * | 9/1994 | Schwark | 524/443 |
| 6,592,991 B1 | * | 7/2003 | Wiesner et al. | 428/404 |
| 7,056,849 B2 | * | 6/2006 | Wan et al. | 501/87 |
| 7,087,656 B2 | * | 8/2006 | Garcia et al. | 521/63 |
| 2005/0036931 A1 | | 2/2005 | Garcia et al. | 423/345 |
| 2005/0159293 A1 | | 7/2005 | Wan et al. | 501/87 |

OTHER PUBLICATIONS

Garcia, C., Lovell, C., Curry, C., Faught, M., Zhang, Y., Wiesner, U., "Synthesis and characterization of block copolymer/ceramic precursor nanocomposites based on a polysilazane", Journal of Polymer Science: Part B: Polymer Physics, V.41, 3346-3350 (2003).*
Philippe Miele et al.; "Borylborazines as New Precursors for Boron Notride Fibres"; Journal of Organometallic Chemistry 690 (2005) 2809-2814.
Carlos B.W. Garcia et al.; "Synthesis and Characterization of Block Copolymer/Ceramic Precursor Nanocomposite Based on a Polysilazane"; Journal of Polymer Science: Pert B: Polymer Physics. vol. 41, 3346-3350 (2003).
Marleen Kamperman et al.; "Ordered Mesoporous Ceramics Stable Up to 1500 °C From Diblock Copolymer Mesophases"; J. Am. Chem. Soc. 2004, 126, 14708-14709.
Vladimir Gevorgyan et al.; "A Novel B(C6F5)3-Catalyzed Reduction of Alcohols and Cleavage of Aryl and Alkyl Ethers and Hydrosilanes"; J. Org. Chem, 2000, 65, 6179-6186.

(Continued)

*Primary Examiner*—Jason L. Lazorcik
(74) *Attorney, Agent, or Firm*—Paul J. DiConza

(57) ABSTRACT

A method of forming a nanoscale ceramic composite generally includes modifying a polymeric ceramic precursor, mixing the modified polymeric ceramic precursor with a block copolymer to form a mixture, forming an ordered structure from the mixture, wherein the modified polymeric ceramic precursor selectively associates with a specific type of block of the block copolymer, and heating the ordered structure for a time and at a temperature effective to form the nanoscale ceramic composite.

28 Claims, 7 Drawing Sheets

OTHER PUBLICATIONS

I.L. Rushkin et al.; "Modification of a Hyperbranched Hydridopolycarbosilane as a Route to New Polycarbosilanes"; Macromolecules 1997, 30, 3141-3146.

James M. Blackwell et al.; "B(C6F5)3-Catalyzed Silation of Alcohols: A Mild, General Method for Synthesis of Silyl Ethers"; J. Org. Chem. 1999, 64, 4887-4892.

Thomas Wideman et al.; "Amine-Modified Polyborazylenes: Second-Generation Precursors to Boron Nitride"; Chem. Mater. 1998, 10, 412-421.

Mario G/ L. Mirabelli et al.; "Transition-Metal-Promoted Reactions of Boron Hydrides. 9. Cp*Ir-Catalyzed Reactions of Polyhedral Boranes and Acetylenes"; J. Am. Chem. Soc. 1988, 110, 449-453.

Kai Su et al.; "Syntheses and Properties of Poly(B-Vinylborazine) and Poly(Styrene-Co-B-Vinylborazine) Copolymers"; Macromolecules 1991, 24, 3760-3766.

Zhengcheng Zhang et al., "Synthesis and Ionic Conductivity of Cyclosiloxanes With Ethyleneoxy-Containing Substituents"; Chem. Mater. 2005, 17, 5646-5650.

\* cited by examiner

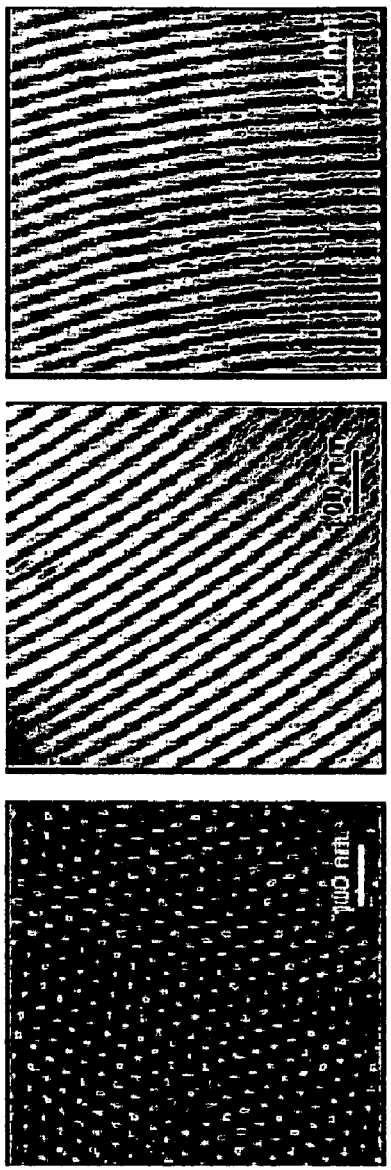

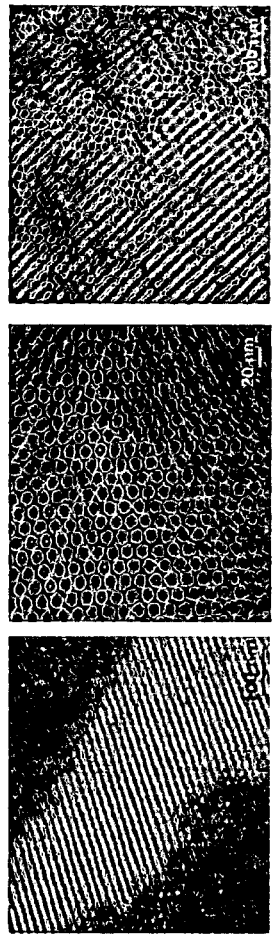
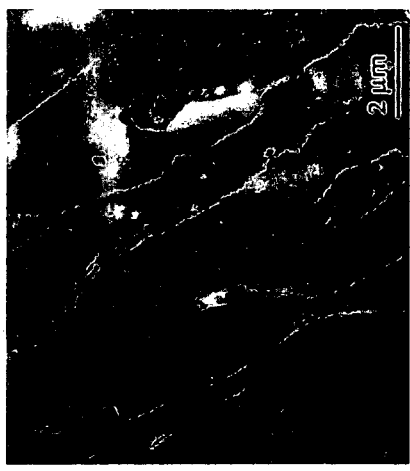
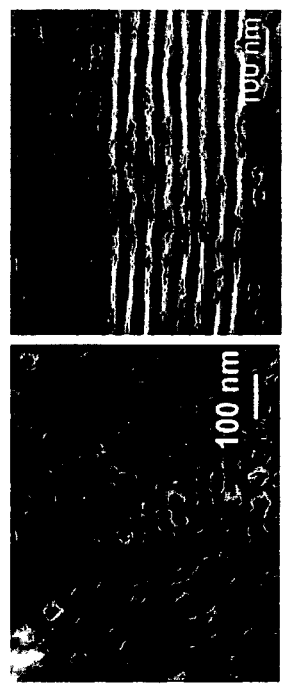

NANOSCALE CERAMIC COMPOSITES AND METHODS OF MAKING

BACKGROUND

This disclosure generally relates to ceramic materials. More particularly, it relates to nanoscale ordered composites of ceramic materials produced through block copolymer assisted assembly.

Composite materials having long-range order exist in nature. Natural composites, such as seashells, exhibit extraordinary mechanical properties that stem from the unique hierarchically ordered structure in these materials. This realization has triggered an effort to mimic nature by building long-range ordered structures at the nanoscale level. Order on the nanoscale can be used, in turn, as the first step towards hierarchically ordered structures ranging from nanometer to micrometer to millimeter scales.

The technology to produce nanoscale inorganic ordered structures includes "top-down" approaches (e.g., sequential deposition and nanolithography) and "bottom-up" approaches (e.g., self-assembly based on ionic and nonionic surfactants and block copolymers). Inorganic ceramic materials, such as silica and other oxides having nanoscale order, have been obtained by self-assembly using organic species as structure-directing agents. Polymeric precursors have been used to develop fibers, coatings, bulk ceramics, nanotubes and nanofibers of boron nitride, boron carbide, silicon nitride and silicon carbide, and to fabricate high temperature microelectromechanical systems (MEMS) with dimensions in the micron to sub-millimeter range.

Current synthetic techniques such as the self-assembly approach have not yielded hierarchically ordered ceramic materials with nanoscale features suitable for high temperature applications. There accordingly remains a need for hierarchically ordered ceramic materials with nanoscale dimensions, and methods for making such materials, that are stable at high temperatures.

BRIEF SUMMARY

A method of forming a nanoscale ceramic composite generally includes modifying a polymeric ceramic precursor, mixing the modified polymeric ceramic precursor with a block copolymer to form a mixture, forming an ordered structure from the mixture, wherein the modified polymeric ceramic precursor selectively associates with a specific type of block of the block copolymer, and heating the ordered structure for a time and at a temperature effective to form the nanoscale ceramic composite.

In another aspect, the method includes mixing two or more polymeric ceramic precursors with a block copolymer comprising two or more types of blocks to form a mixture, self-assembling the mixture, wherein the two or more polymeric ceramic precursors selectively associate with the two or more types of blocks of the block copolymer, cross-linking at least a portion of one of the polymeric ceramic precursors to form an ordered structure, and heating the ordered structure for a time and at a temperature effective to form the nanoscale ceramic composite.

A method of modifying a polycarbosilane generally includes reacting the polycarbosilane with an alcohol or an ether in the presence of a tris(pentafluorophenyl) borane catalyst to functionalize at least a portion of the silyl groups.

A polycarbosilane generally has the structure:

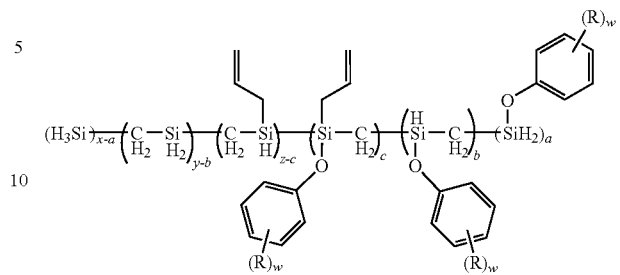

wherein R is an alkyl group having 8 to 48 carbon atoms, wherein x, y, and z are each independently an integer greater than 1, wherein a, b, and c are each independently zero or an integer 1 or greater, provided that at least one of a, b, or c is 1 or greater, wherein a is less than or equal to x, wherein b is less than or equal to y, and wherein c is less than or equal to z.

The above described and other features are exemplified by the following figures and detailed description.

BRIEF DESCRIPTION OF DRAWINGS

Referring now to the figures, which are exemplary embodiments and wherein like elements are numbered alike:

FIG. 3 depicts representative TEM images of ordered polybutadiene-block-polyethylene oxide polymer/polysilazane mixtures, having polysilazane concentrations of (a) 0, (b) 37, (c) 45, (d) 62, (e) 76, and (f) 83 weight percent, based on the total weight of the mixture;

FIG. 6 depicts representative TEM images of (a)-(f) an ordered polymer structure and (g) a ceramic composite produced using polysilazane and poly(dipentylaminoborazylene) as the polymeric ceramic precursors and a polybutadiene-block-polyethylene oxide as the block copolymer;

DETAILED DESCRIPTION

Disclosed herein are ordered nanoscale ceramic composites and methods for making such materials using block copolymers as structure directing agents. In contrast to the prior art, the ceramic composites disclosed herein are thermally stable at high temperatures (e.g., at least about 800° C.), and are therefore suitable for use in applications which expose the ceramic composites to such temperatures. For example, the ceramic composites may form at least a portion of a component designed for use in hot gas path assemblies, such as turbine assemblies, boilers, combustors, and the like. These components include, but are not limited to, sensors, membranes, and high strength structural components, such as nozzles, combustor liners, blades, shrouds, and the like.

As used herein, the term "nanoscale" generally refers to those materials having nanoscale features, i.e., having an average longest domain dimension of less than or equal to about 100 nanometers (nm). Also, as used herein, the terms "first", "second", and the like do not denote any order or importance, but rather are used to distinguish one element from another, and the terms a "an", and "the" do not denote a limitation of quantity, but rather denote the presence of at least one of the referenced item. Furthermore, all ranges directed to the same quantity of a given component or measurement are inclusive of the endpoints and independently combinable. The modifier "about" used in connection with a quantity is inclusive of the stated value and has the meaning dictated by the context or includes at least the degree of error associated with measurement of the particular quantity.

The ceramic composites comprise two or more distinct phases, at least one of which is a ceramic composition. For example, the composite may comprise carbon (in graphitic, diamond, and/or amorphous form) and a (i.e., at least one) ceramic phase; or the composite may comprise two or more ceramic phases. Suitable ceramic compositions include oxides, carbides, nitrides, borides, oxycarbides, oxynitrides, carbonitrides, and the like. Exemplary ceramic compositions include silicon oxide, silicon carbide, silicon nitride, silicon carbonitride, silicon oxynitride, silicon oxycarbonitride, silicon oxycarbide, silicon boron carbonitride, boron nitride, boron carbide, boron carbonitride, hafnium boride, zirconium carbide, zirconium boride, and the like.

Figure 1:
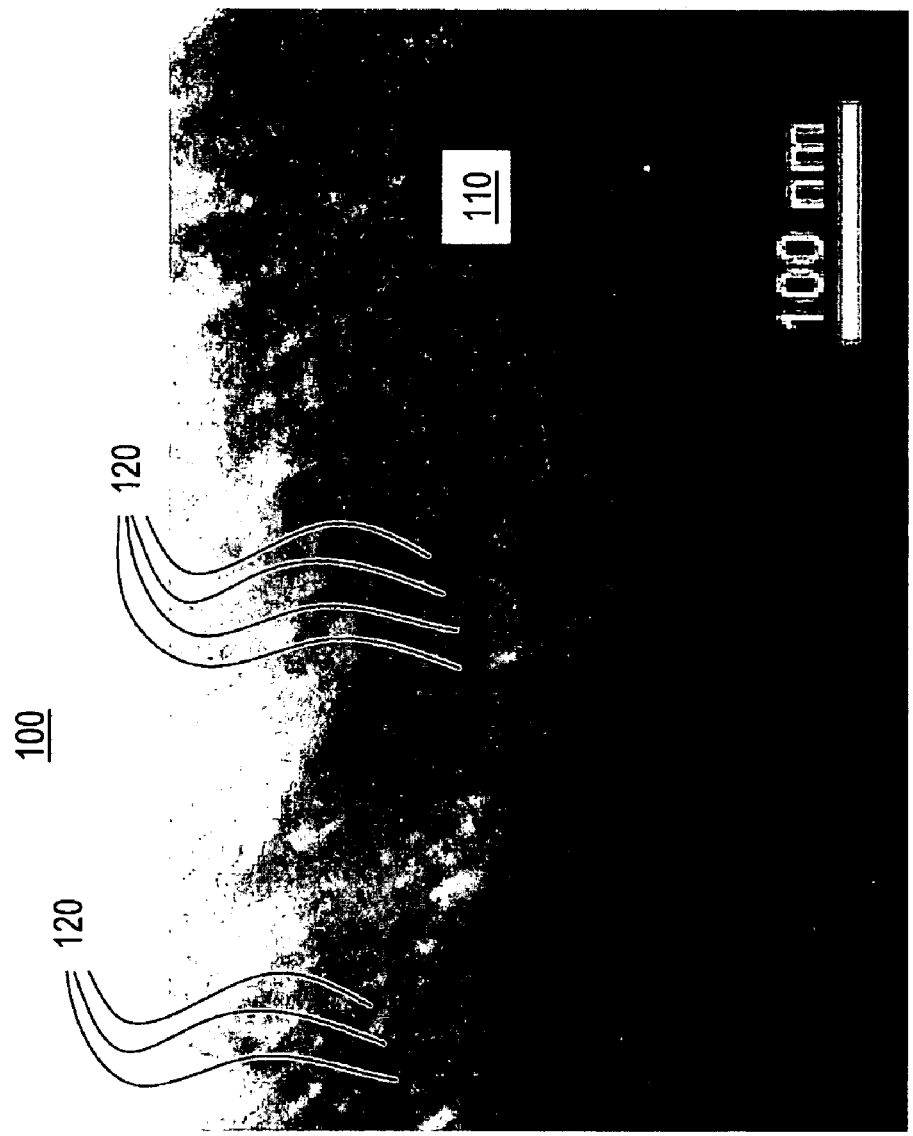
FIG. 1 is a representative transmission electron microscope (TEM) image of a C/SiCN(—O) composite.

An exemplary nanoscale ordered ceramic composite, generally indicated by reference numeral 100, is shown in FIG. 1. Specifically, FIG. 1 is a transmission electron microscope (TEM) image of a nanoscale composite 100 of amorphous carbon and silicon oxycarbonitride (C/SiCN(—O)). The ceramic composition (i.e., SiCN(—O)) 110 can be seen as having a plurality of ordered regions 120, each with a periodicity on at least the nanometer scale. Within an individual region 120, periodic order is maintained from about 1 nanometer (nm) to about 1000 nm and, more specifically from about 10 nm to about 100 nm. The plurality of ordered regions 120 can be arranged in such a manner as to exhibit long range periodicity (e.g., from about one micrometer (μm) to about 5 millimeters (mm)), thus providing the overall composite 100 with a lamellar, hexagonal, cubic, perforated lamellar, gyroid, double gyroid, double diamond, bicontinuous, or like structure.

The method for making the ordered nanoscale ceramic composites 100 generally includes mixing a polymeric precursor to a ceramic composition with a block copolymer (BCP), forming an ordered structure comprising the polymeric ceramic precursor and block copolymer, and heating the ordered structure for a time and at a temperature effective to form the ordered nanoscale ceramic composite.

The polymeric ceramic precursor may be any solid or liquid composition that results in a ceramic composition upon heating to a selected temperature. For example, many borane-containing structures may be suitable for use as precursors to boride compositions; many borazine-containing structures may be suitable for use as precursors to boron nitride or boron carbonitride; many carbosilane-containing structures may be suitable for use as precursors to silicon carbide; and the like. Exemplary polymeric precursors include polysilazane, polycarbosilane, polyborocarbosilane, polyborocarbosilazane, polyborazylene, ring-opened polynorbomene functionalized with decaborane, poly(dipentylaminoborazylene), alkylaminoborazine, or the like.

The block copolymer may be any block copolymer, including diblock copolymers, triblock copolymers, linear BCPs, branch BCPs, star block copolymers, and the like. Suitable components of the BCP include butadienes (PB), polyisoprene (PI), polydimethylsiloxane, polystyrene (PS), polyvinylpyridene (PVP), polyethylene, polypropylene, polyisobutylene, polypropylene oxide (PPO), polyethylene oxide (PEO), polyphenylene oxide, polyethylene propylene, polyether imide, polyimides, polycarbonates, polyacrylates, polymethacrylates, polylactides, polyacrylonitrile, polymethacrylic acid, or the like.

The mixing of the polymeric ceramic precursor and the block copolymer can be achieved by solution blending, melt blending, or like techniques. Desirably, the mixing is effective to produce a homogeneous or substantially homogeneous mixture. In order to produce such a mixture, the mixing process may involve the use of a shear force, extensional force, compressive force, ultrasonic energy, electromagnetic energy, thermal energy or a combination comprising at least one of the foregoing forces or forms of energy.

With solution blending, the polymeric ceramic precursor and/or the block copolymer may be dissolved or dispersed in a solvent. Multiple separate solutions, each having the same solvent, may be prepared and subsequently combined, or a single solution comprising the polymeric ceramic precursor and the block copolymer may be prepared in one step. Any of a variety of solvents may be used provided that the solvent does not substantially adversely affect the mixing or ordering processes.

Exemplary polar solvents include diethyl ether, tetrahydrofuran, acetonitrile, nitromethane, or the like, or a combination comprising at least one of the foregoing solvents. Exemplary non-polar solvents include benzene, toluene, methylene chloride, chloroform, hexane, or the like, or a combination comprising at least one of the foregoing solvents. Still further, solvent mixtures, such as a polar solvent and a non-polar solvent may also be used.

The resulting solution(s) comprises from about 0.1 weight percent (wt %) to about 10 wt % of the polymeric ceramic precursor and/or block copolymer. In a specific embodiment, the solution(s) contains from about 0.5 wt % to about 5 wt % of the polymeric ceramic precursor and/or block copolymer. In one embodiment, once the polymeric ceramic precursor and block copolymer are sufficiently mixed, the solvent may be removed (e.g., by low temperature heating, evaporation of the solvent at ambient temperature, or the like).

With melt blending, no solvent is used. The block copolymer and the polymeric ceramic precursor are heated to a temperature greater than or equal to about the lowest glass transition temperature of the block copolymer, but less than or equal to about the decomposition temperature of the block copolymer, and are subjected to any of the above described forces and/or forms of energy to effect mixing.

Once the mixture has been formed, a ratio of the weight of the polymeric ceramic precursor (regardless of the number of individual precursors) to the weight of the block copolymer may be about 5:95 to about 95:5.

Optionally, after mixing, the mixture of the block copolymer and the polymeric ceramic precursor may be cast, molded, extruded, spin-coated or the like, into a selected shape for further processing.

Forming the ordered structure comprising the polymeric ceramic precursor and block copolymer can be achieved by self-assembling the mixture and cross-linking at least a portion of the polymeric ceramic precursor. During self-assembly of the mixture, the block copolymer acts as a template for organizing the polymeric ceramic precursor in a particular arrangement. Specifically, self-assembly of the mixture is based on each polymeric ceramic precursor selectively targeting (e.g., swelling) a particular domain or block of the block copolymer with which it is compatible without causing macro-phase separation of the precursor from the block copolymer. Subsequent cross-linking of the polymeric ceramic precursor stabilizes the ordered structure generated during the self-assembly.

When one polymeric ceramic precursor is present in the mixture, the polymeric ceramic precursor will generally target only one type of block in the block copolymer. However, the polymeric ceramic precursor may be chemically modified, prior to mixing with the block copolymer, in a manner that results in the modified polymeric ceramic precursor targeting at least a different block of the block copolymer than would have been targeted by the unmodified precursor (i.e., the modified precursor may target more than one type of block). This modification may be desirable if, for example, an increased (or decreased) amount of ceramic phase is needed and the miscibility in the type of block that would have been targeted by the unmodified polymeric ceramic precursor is lower (or higher) than that with another type of block.

When two or more polymeric ceramic precursors are present in the mixture, the polymeric ceramic precursors desirably each selectively target different types of blocks in the block copolymer. Alternatively, these polymeric ceramic precursors may target the same and/or different types of blocks as may be desired for different applications. These polymeric ceramic precursors can also be modified such that they target at least a different type (and, if also desired, the same type) of block than would have been targeted by the unmodified precursor.

Various permutations are contemplated herein, depending on the number of polymeric ceramic precursors (modified and/or unmodified) and the number of different types of blocks within the block copolymer, and would be apparent to those of skill in the art. By way of example, and for clarification, in embodiments wherein two polymeric ceramic precursors (modified and/or unmodified) are used with a block copolymer having two different types of blocks, there are four distinct possibilities for phase targeting. Specifically, each polymeric ceramic precursor may target a different type of block, both polymeric ceramic precursors may target the same type of block, both polymeric ceramic precursors may target both types of blocks, or one polymeric ceramic precursor may target one type of block while the other polymeric ceramic precursor targets both types of blocks. Given the same two polymeric ceramic precursors, and the same block copolymer, it may be possible, by chemically modifying one or both of the polymeric ceramic precursors to alternate between each of the four scenarios just described.

Chemical modification of a polymeric ceramic precursor may be effected in any of variety of ways, provided that the desired ceramic composition may still be formed by the modified precursor. In one embodiment, the polymeric ceramic precursor may be functionalized to alter its polarity. In another embodiment, the modification may be effected by polymerizing the polymeric ceramic precursor with a different monomer or polymer to form a copolymer comprising the polymeric ceramic precursor.

Figure 2:
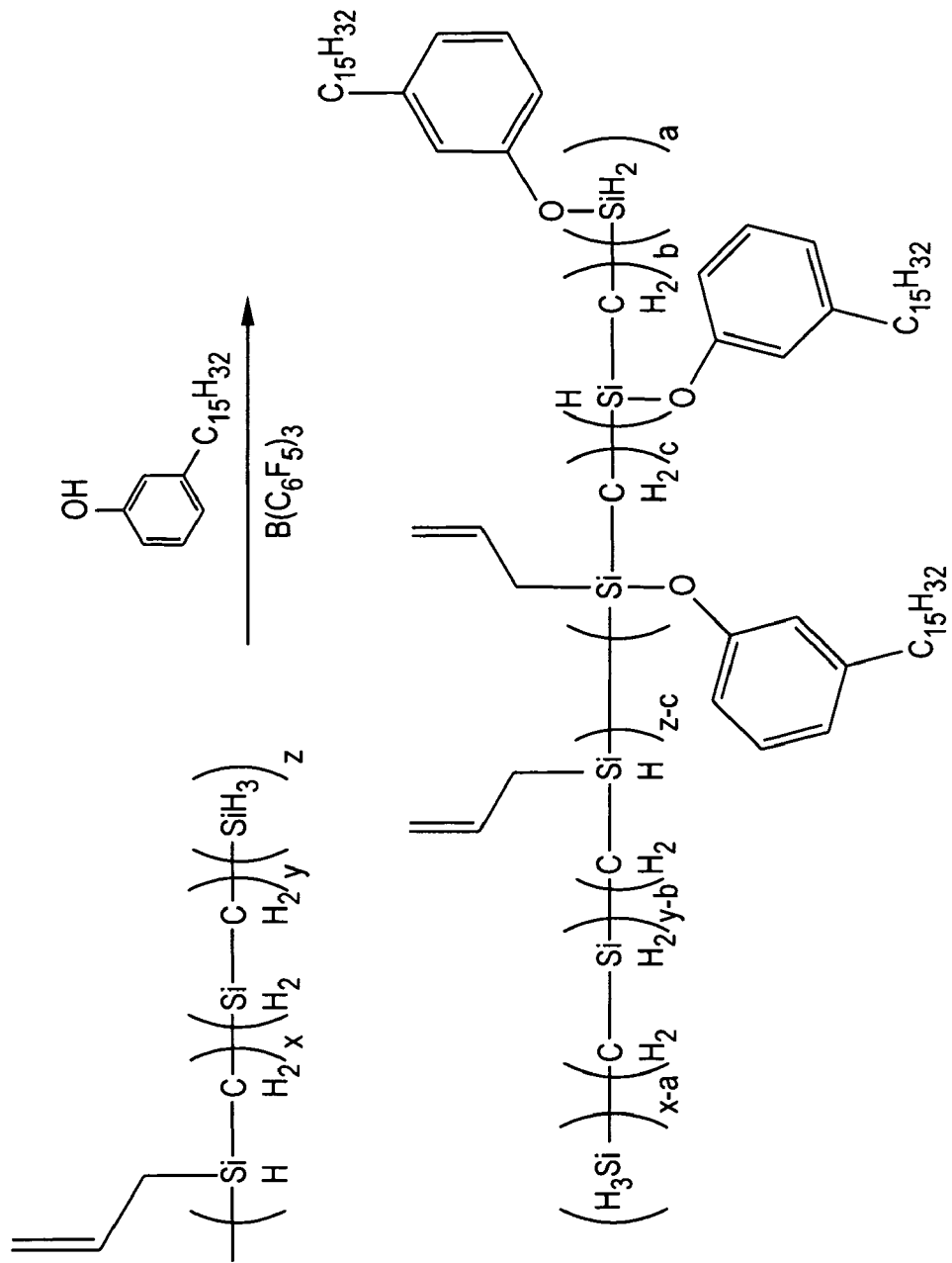
FIG. 2 depicts an exemplary reaction scheme for modifying a polycarbosilane.

By way of example, a polycarbosilane, which can be a precursor to SiC, can be functionalized (at any Si-H containing group) with an alcohol or ether to provide silyl ether groups. In a specific example, the polycarbosilane can be functionalized with an alkylphenol to provide silyl aryloxy groups. The alcohol (e.g., alkylphenol) or ether can be substituted in the any of the ortho-, meta-, or para-positions. Additionally, a di- or tri- substituted alcohol or ether can be used, wherein the substituents are desirably meta- and/or para- (to the hydroxy group). In this manner, the polycarbosilane, which when unmodified does not target hydrophobic blocks (e.g., PB, PI, PS, and the like) now targets these hydrophobic blocks. An exemplary reaction scheme for modifying a polycarbosilane is shown in FIG. 2, wherein a partially allyl modified polycarbosilane is reacted with an alkyl-substituted phenol (in this case with meta-pentadecylphenol) using tris (pentafluorophenyl) borane as the catalyst. Other alkyl groups, having 8 to 48 carbon atoms, specifically 12 to 36 carbon atoms, may be used in this reaction, the choice of which depends on the properties of the targeted type of block. Any one of the silyl groups having an (i.e., at least one) available hydrogen can be substituted during the reaction.

Advantageously, this type of reaction can take place without any externally applied heat and with minimal or no premature cross-linking of the modified polycarbosilane. Another advantage of this type of reaction is that a post-synthetic purification step is not necessary, and the modified polycarbosilane can be used directly after synthesis. Yet another advantage of this type of reaction lies in the fact that platinum hydrosilation catalysts are not effective at modifying the polycarbosilane to any significant extent.

By way of another example, borazine, which can be a precursor to BN or BCN, can be functionalized with acetylene to form a styrene analog (vinyl borazine), and subsequently polymerized to form a polystyrene analog that would then be able to target, for example, polyethylene oxide blocks in a block copolymer. Alternatively, the vinyl borazine analog may be copolymerized with styrene to form a copolymer. In yet another alternative, the borazine-containing styrene analog may be copolymerized with butadiene to form a copolymer, which would target polybutadiene blocks in a block copolymer.

Other precursors can be modified to selectively target a specific type of block in a block copolymer as would be recognized by those skilled in the art in view of this disclosure.

When two or more polymeric ceramic precursors are present in the mixture, optional mitigating additives may be added to the mixture to minimize or prevent interactions (e.g. reaction or cross-linking) between each of the two or more polymeric ceramic precursors. The choice of additive will depend on the particular precursors, and will be apparent to those skilled in the art in view of this disclosure.

By way of example, polysilazane (PSZ), which is a silicon oxycarbonitride precursor, and one of alkylaminoborazine (AABZ) and poly(dipentylaminoborazylene) (DPBZ), which are both boron nitride ceramic precursors, can be mixed with a polybutadiene-block-polyethylene oxide (PB-b-PEO) block copolymer such that both precursors (i.e., PSZ and one of the two BN precursors) target the PEO blocks of the block copolymer. If AABZ is used as the BN precursor, neither macro-phase separation nor PB phase contamination with either of the two precursors is observed. However, if DPBZ is used in place of the AABZ, trace or low levels of PSZ are observed in the PB phase. The addition of the optional additive, in this case triethylamine (TEA), to the mixture prior to self-assembly has the effect of eliminating the presence of Si in the PB phase as well as inhibiting any macro-phase separation that may occur. In this example TEA is selected for its ability to complex with boron atoms in DPBZ to mitigate their interactions with other functional groups in PSZ such as amines and olefins in order to prevent macro-phase separation and phase contamination.

After self-assembly of the mixture, at least a portion of the polymeric ceramic precursor(s) is cross-linked to stabilize the ordered structure generated during the self-assembly such that it can be substantially preserved during the subsequent heating step. In one embodiment, "substantially preserved", means that the structure maintains the nanoscale features without a discernible morphology, as would be determined for example by X-ray diffraction. In another embodiment, "substantially preserved", means that the ordered structure does not undergo an order-to-disorder transformation (ODT). Depending on the extent of cross-linking, the stabilized ordered mixture may vary from a soft rubber-like form to a solid glass-like form.

The polymeric ceramic precursor may be cross-linked using heat (e.g., at a temperature of about 50 to about 400 degrees Celsius (° C.)). Such heating may occur in air, hydrogen, ammonia, in an inert atmosphere such as nitrogen or argon, or under vacuum. In one embodiment, the heat applied during cross-linking can cause an order-to-order transition to a structure-type that is more stable at the temperature of the applied heat than that observed at lower or room temperatures. Thus, this new structure-type will be the ordered structure that is substantially preserved during the subsequent heating step wherein the ceramic composite is formed.

In addition (or in the alternative) to heat, the polymeric ceramic precursor may be cross-linked using a free radical initiator. The free radical initiator may be an organic-peroxide (e.g., dicumyl peroxide), an azobisalkylcarbonitrile, an alkoxyamine, a dithioester, a dithiocarbamate, or the like. The free radical initiator is generally added during the mixing step, and is present in an amount of less than or equal to about 10 wt %, with respect to the weight of the polymeric ceramic precursor(s) being cross-linked.

In one embodiment, the polymeric ceramic precursor may be functionalized with an alkoxyamine, dithioester, dithiocarbamate, peroxide, azobisakylcarbonitrile or like moiety, which can be decomposed to provide the free radical initiator when heat is applied. For example, the above-described borazine-containing styrene analog may be functionalized to have an aliphatic alkoxyamine, the carbon-oxygen bond of which can be broken at about 125° C.

After forming the ordered structure comprising the polymeric ceramic precursor and block copolymer, the ordered mixture is subjected to a controlled heat treatment for a time and at a temperature effective to form the ordered nanoscale ceramic composite 100. During this heat treatment, the block copolymer is decomposed and the polymeric ceramic precursor undergoes ceramization.

The temperature of the heat treatment is generally about 500° C. to about 1500° C. The duration of the heat treatment may be about 1 minute to about 7 days or longer if necessary. The ordered structure is generally brought to the heat treatment temperature at a rate of about 0.1° C. per minute to about 20° C. per minute. In one embodiment, the heat treatment may be carried out in the presence of a gas, such as ammonia, nitrogen, argon, or the like.

The specific conditions under which the heat treatment takes place depend on the particular polymeric ceramic precursor, block copolymer, and/or heating atmosphere, and can be determined by those skilled in the art in view of this disclosure without undue experimentation. For example, when polysilazane is used as the polymeric ceramic precursor, amorphous silicon nitride is produced if the heat treatment occurs in the presence of ammonia; silicon carbonitride is produced if the heat treatment occurs in the presence of nitrogen; and silicon carbide is produced if the heat treatment occurs in the presence of an inert gas (e.g., argon). Similarly, polyborazylene may be converted into either boron carbonitride or boron nitride, depending upon the atmosphere under which the heat treatment is performed.

During the heat treatment, the block copolymer leaves behind a carbon residue, and possibly oxygen if, for example, the block copolymer comprises PEO or PPO. Localized viscous flow of the polymeric ceramic precursor under the driving force of surface tension leads to elimination of voids left behind by the decomposition of block copolymer. In addition, the carbon residue from the block copolymer prevents the formation of a featureless monolith of ceramic. As a result of eliminating voids and the presence of residual carbon, a lamellar nanocomposite that inherits the structural feature of the self-assembled mixture is obtained.

The volume fraction of the remaining pores or voids within the entire nanoscale ordered ceramic composite 100 is less than or equal to about 95 percent. If highly dense ceramic composites are desired, the volume fraction of the remaining pores or voids within the entire nanoscale ordered ceramic composite 100 can be less than or equal to about 15 percent, specifically less than or equal to about 10 percent.

This disclosure is further illustrated by the following non-limiting examples.

EXAMPLE 1

Silicon Oxycarbonitride and Amorphous Carbon Composites

In this example, ordered ceramic composites of C/SiCN (—O) were prepared using polysilazane (PSZ) as the polymeric ceramic precursor and polybutadiene-block-polyethylene oxide (PB-b-PEO) as the block copolymer.

PB-b-PEO, PSZ, and dicumyl peroxide initiator were dissolved in a 1:1 mixture of tetrahydrofuran and chloroform. The PB-b-PEO had a molecular weight ($M_n$) and polydispersity index ($M_w/M_n$) of 27000 and 1.05, respectively. The volume fraction of the PEO was 0.20 as determined by $^1$H NMR analysis. The dicumyl peroxide was used in an amount of 2 wt % of the PSZ. Several solutions of the dissolved PB-b-PEO, PSZ, and dicumyl peroxide initiator were made, having mass fractions of PSZ ranging from 0.17 to 0.89. Once a homogeneous solution was obtained, the solvent was evaporated from each of the solutions.

Each mixture was independently annealed at 100° C. for 12 hours to allow the mixture to self-assemble and cross-link the PSZ. FIG. 3(a) illustrates a representative TEM bright field image of the block copolymer (absent any PSZ). The bright phase corresponds to the PEO domains, which are hexagonally close packed cylinders. FIGS. 3(b) through (f) illustrate representative TEM bright field images of a series of ordered structures comprising 37, 45, 62, 76, and 83 wt % PSZ, respectively. In these images, the bright phases correspond to the PB domains. As evidenced by the TEM images, incorporation of increasing amounts of PSZ led to an increase in the size of the PEO/PSZ domains, which manifested as changes in morphology from cylindrical to lamellar to micellar worm-like structures. Electron energy loss spectra indicated that no trace of PSZ could be found in the PB domains.

The ordered structures were independently heated in a tube furnace, under nitrogen, at a constant rate of 0.5 to 20° C. to final temperatures of 700 to 1500° C. to form the ceramic composites. Mass spectrometry indicated that decomposition of the block copolymer occurred with gradual weight loss caused by the emission of methane, ethane, hydrogen, carbon monoxide, ammonia and water. An amorphous carbon phase was formed from the decomposition or pyrolysis of PB, which occurred between 400 and 500° C.; decomposition of PEO occurred between 350 and 400° C. and an amorphous silicon carbonitride phase was converted from the PSZ in the temperature range of 400 to 800° C.

Brunauer-Emmett-Teller (BET) adsorption-desorption experiments revealed that at temperatures up to about 400° C., the ordered mixture is fully dense. At about 500° C., porosity is observed owing to the decomposition of the block copolymer. Increasing the temperature leads to closure of the pores because of the viscous flow of the PSZ as it undergoes ceramization. The pore volume fraction in the final ceramic composite having an initial PSZ content of 62 wt % was about 0.02. For the final ceramic composite having an initial PSZ content of 45 wt %, the pore volume fraction was about 0.07. The average open pore size was determined to be about 10 nm.

The composition of the ceramic phase (i.e., the silicon oxycarbonitride) depended on the initial concentration of PSZ in the mixture. For example, for the final ceramic composite having initial PSZ content of 62 and 45 wt %, the ceramic phase had an empirical formula of about $Si_{1.00}C_{0.66}N_{1.30}O_{0.27}$ and $Si_{1.00}C_{0.60}N_{1.17}O_{0.48}$, respectively, as determined from X-ray fluorescence (XRF) analysis.

FIG. 1 illustrates the ceramic composite having an initial PSZ content of 45 wt %. A comparison of FIG. 1 and FIG. 3(c) illustrate that the overall lamellar structure was maintained. This trend was observed for each of the samples described in this example.

This example clearly provides a method of tailoring the morphology of a ceramic composite by varying the concentration of the polymeric ceramic precursor in the mixture.

EXAMPLE 2

Phase Targeting Via Polymeric Ceramic Precursor Modification

In this example, the polarity of a polycarbosilane was modified to transition the polycarbosilane from being incompatible with polybutadiene to being compatible with polybutadiene.

Figure 4A:
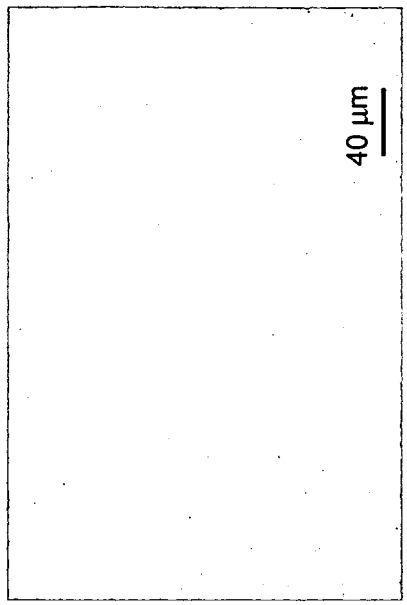
FIG. 4 illustrates the compatibility of a polycarbosilane with (a) polybutadiene and (b) polysilazane, and a modified polycarbosilane with (c) polybutadiene and (d) polysilazane.
Figure 4B:
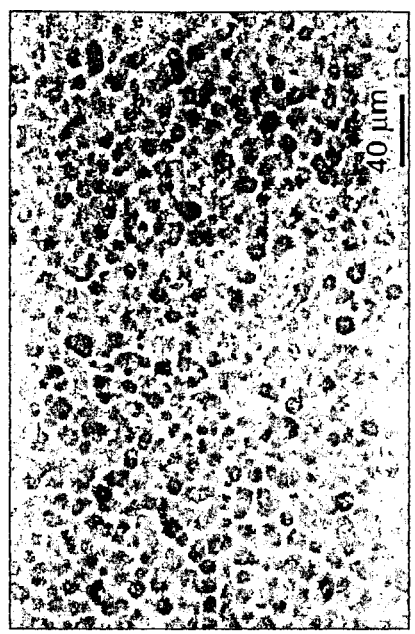

FIGS. 4(a) and (b) are optical microscopy images illustrating the compatibility of a partially allyl-modified polycarbosilane with polybutadiene and with polysilazane, respectively. As indicated by the phase separation shown in FIG. 4(a), the polycarbosilane was not compatible with polybutadiene. In addition, there was no indication in FIG. 4(b) of any incompatibility with the polysilazane. Therefore, if both the polycarbosilane and the polysilazane were to be used as polymeric ceramic precursors, they may both target the same type of block of a given block copolymer.

The partially allyl-modified polycarbosilane was reacted according to the reaction scheme shown in FIG. 2. Specifically, 0.5 grams (g) of allyl-modified polycarbosilane was dissolved in 10 milliliters (mL) of chloroform; and 0.75 g of meta-pentadecylphenol was added to this solution. Once the solution was homogeneous, about 30 to about 50 milligrams (mg) of solid tris(pentafluorophenyl) borane was added. Within minutes, hydrogen gas evolved from the reaction vessel. Upon completion, the reaction could be terminated by adding about 5 drops of pyridine to complex the borane catalyst. $^1$H-NMR confirmed the consumption of Si—H moieties (4.4-3.4 ppm); and $^{29}$Si-NMR confirmed the formation of O—Si bonds resulting from the silylation of Si—H groups on the allyl-modified polycarbosilane. The resulting reaction mixture was used directly to assess compatibility. Furthermore, combining the reaction mixture with appropriate amounts of PB-b-PEO and PSZ resulted in the formulation that led to ordered ceramics with nanoscale features.

Chloroform was added to the phenol-modified polycarbosilane reaction mixture to adjust the polymeric precursor content to about 2 wt %. A solution with 2 wt % polybutadiene in chloroform was mixed with the solution of phenol-modified polycarbosilane, effective to make a solution that contained 1 wt % polybutadiene and 1 wt % phenol-modified polycarbosilane. This mixed solution was drop-cast onto a glass slide, dried, and was heated at 100° C. for 12 hours under vacuum. The heat-treated sample was then examined by optical microscopy to assess the compatibility between the phenol-modified polycarbosilane and polybutadiene. A solution with 2 wt % polysilazane in chloroform was mixed with the 2 wt % solution of phenol-modified polycarbosilane to make a solution that contained 1 wt % polybutadiene and 1 wt % phenol-modified polycarbosilane. This mixed solution was drop-cast onto a glass slide, dried and heated at 100° C. for 12 hours under vacuum. The heat-treated sample was then examined by optical microscopy to assess the compatibility between the phenol-modified polycarbosilane and polysilazane.

Figure 4C:
Figure 4D:
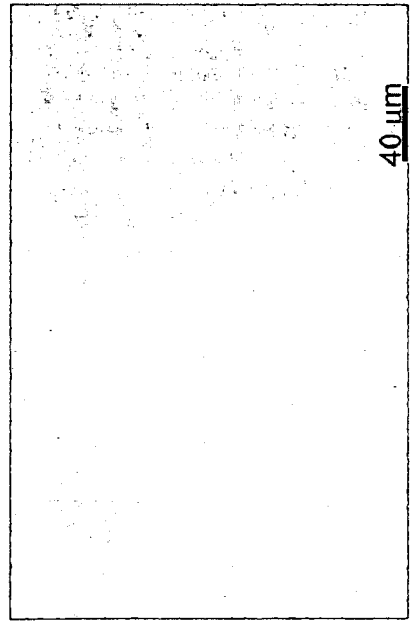

FIG. 4(c) and (d) illustrate the compatibility of the phenol-modified polycarbosilane with polybutadiene and with polysilazane, respectively. The polycarbosilane, after chemical modification, showed no phase separation from polybutadiene, as evidenced in FIG. 4(c). However, as indicated by the clear phase separation seen in FIG. 4(d), the phenol-modified polycarbosilane was no longer compatible with polysilazane. In comparing FIG. 4(a) with FIG. 4(c), and FIG. 4(b) with FIG. 4(d), the compatibility of the polycarbosilane with the polybutadiene and polysilazane, respectively, was reversed upon chemical modification. Accordingly, if both the modified polycarbosilane and the polysilazane were to be used as polymeric ceramic precursors, they would target different types of blocks of a given block copolymer.

EXAMPLE 3

SiC/SiCN Composite Formed Using Modified Precursor

In this example, an ordered composite comprising two ceramic compositions was prepared using polysilazane (PSZ) and the modified polycarbosilane (m-PCS) prepared in Example 2 as the polymeric ceramic precursors, and a polybutadiene-block-polyethylene oxide (PB-b-PEO) as the block copolymer.

PB-b-PEO, PSZ, m-PCS, and dicumyl peroxide initiator were dissolved in a 1:1 mixture of tetrahydrofuran and chloroform. The PB-b-PEO had a molecular weight (Mr) and polydispersity index ($M_w/M_n$) of 27000 and 1.05, respectively. The volume fraction of the PEO was 0.20 as determined by $^1$H NMR analysis. The dicumyl peroxide was used in an amount of 2 wt % of the PSZ. The dissolved PB-b-PEO, PSZ, m-PCS, and dicumyl peroxide initiator had a mass fraction of PSZ of 0.533, and a mass fraction of m-PCS of 0.133. Once a homogeneous solution was obtained, the solvent was evaporated.

The mixture was annealed at 100° C. for 12 hours to allow the mixture to self-assemble and cross-link the PSZ and m-PCS. FIG. 5(a) illustrates a representative TEM bright field image of the ordered structure. In this image, the bright phase corresponds to the PB/m-PCS domains.

The ordered structure was heated in a tube furnace, under nitrogen, at a constant rate of 0.5 to 20° C. to final temperatures of 700 to 1500° C. to form the ceramic composite.

Figure 5B:
FIG. 5 depicts representative TEM images of (a) an ordered polymer structure and (b) a ceramic composite produced using polysilazane and a modified polycarbosilane as polymeric ceramic precursors, and polybutadiene-block-polyethylene oxide as the block copolymer.
Figure 5A:
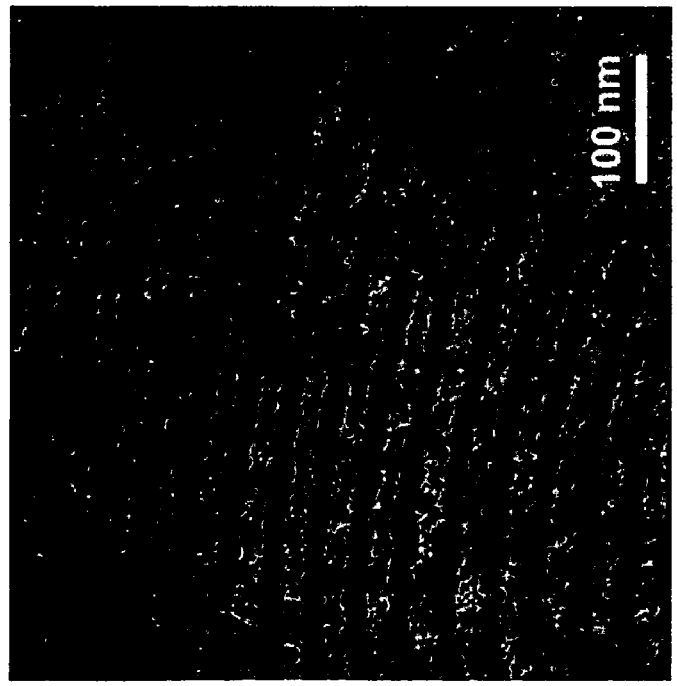

FIG. 5(b) illustrates a representative TEM bright field image of the final ceramic composite. In this image, the bright phase corresponds to the silicon carbide and the dark field corresponds to the silicon oxycarbonitride.

EXAMPLE 4

Hierarchically Ordered Ceramic Composite

In this example, an ordered composite with complex morphology comprising two ceramic compositions was prepared using polysilazane (PSZ) and poly(dipentylaminoborazylene) (DPBZ) as the polymeric ceramic precursors, and a polybutadiene-block-polyethylene oxide (PB-b-PEO) as the block copolymer. The complex structure contained ordered structures at two different length scales in macro-phase separated regions.

PB-b-PEO, PSZ, DPBZ, and dicumyl peroxide initiator were dissolved in a 1:1 mixture of tetrahydrofuran and chloroform. The PB-b-PEO had a molecular weight ($M_n$) and polydispersity index ($M_w/M_n$) of 27000 and 1.05, respectively. The volume fraction of the PEO was 0.20 as determined by $^1$H NMR analysis. The dicumyl peroxide was used in an amount of 2 wt % of the PSZ. The dissolved PB-b-PEO, PSZ, DPBZ, and dicumyl peroxide initiator had a mass fraction of PSZ of 0.533, and a mass fraction of DPBZ of 0.133. Once a homogeneous solution was obtained, the solvent was evaporated.

The mixture was annealed at 100° C. for 12 hours to allow the mixture to self-assemble and cross-link the PSZ and DPBZ. FIG. 6(a) is a representative TEM bright field image at low magnification of the ordered structure. FIGS. 6(b-d) show high magnification images of the light regions seen in FIG. 6(a). Lamellar (FIG. 6(b)), cylindrical (FIG. 6(c)), and spherical (FIG. 6(d)) ordered structures can be found within these regions. The domain size of ordered structures is in accordance with the domain size defined by the chain length of the block copolymer. FIG. 6(e-f) illustrates the representative morphology of the dark regions seen in FIG. 6(a). Lamellar (FIG. 6(e)) or worm-like micellar (FIG. 6(f)) structures having domain sizes about 2 to about 3 times greater than expected were observed.

The ordered structure was heated in a tube furnace, under nitrogen, at a constant rate of 0.5 to 20° C. to final temperatures of 700 to 1500° C. to form the ceramic composite.

FIG. 6(g) illustrates a representative TEM bright field image of the final ceramic composite. The complex structure with order at two length-scales was maintained during heating. Specifically, the larger structural features can be found in the top left and the smaller structural features can be found in the upper far right of FIG. 6(g).

This example serves to illustrate the ability to target one phase with two ceramic precursors, obtain order at two length scales simultaneously, and retain the order at two length scales after heating.

EXAMPLE 5

Ceramic Composite Formed Using A Mitigating Additive

In this example, an ordered composite comprising two ceramic compositions was prepared using polysilazane (PSZ) and poly(dipentylaminoborazylene) DPBZ as the polymeric ceramic precursors, and a polybutadiene-block-polyethylene oxide (PB-b-PEO) as the block copolymer. In this example, triethylamine (TEA) was added to complex the DPBZ, in order to mitigate the reaction between DPBZ and PSZ, thereby leading to an ordered structure with uniform domain size.

TEA and DPBZ were dissolved into chloroform to form a solution containing 2.5 wt % TEA and 2.5 wt % DPBZ. The solution containing 5 wt % DPBZ-TEA (DPBZ-TEA) was stirred in an inert atmosphere for 4 hours. PB-b-PEO, PSZ, and dicumyl peroxide were dissolved in chloroform. The PB-b-PEO had a molecular weight ($M_n$) and polydispersity index ($M_w/M_n$) of 27000 and 1.05, respectively. The volume fraction of the PEO was 0.20 as determined by $^1$H NMR analysis. The dicumyl peroxide was used in an amount of 2 wt % of the PSZ. The dissolved PB-b-PEO, PSZ, was added to the DPBZ-TEA solution to form a mixture. The mixture had a mass fraction of PSZ of 0.308, and a mass fraction of DPBZ-TEA of 0.308. Once a homogeneous solution was obtained, the solvent was evaporated.

Figure 7:
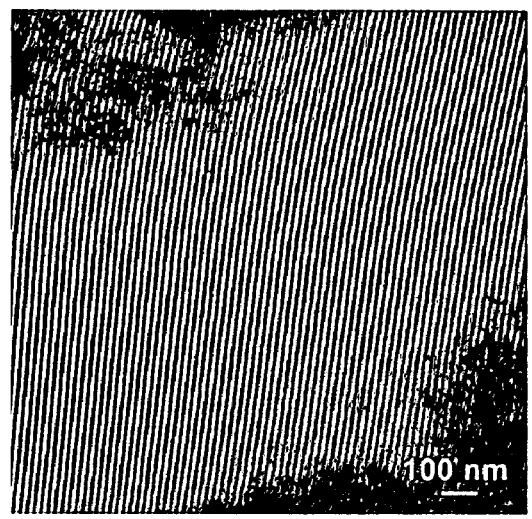
FIG. 7 depicts a representative TEM image of an ordered structure produced using polysilazane and poly(dipentylaminoborazylene) as polymeric ceramic precursors, polybutadiene-block-polyethylene oxide as the block copolymer, and triethylamine as a mitigating additive.

The mixture was annealed at 100° C. for 12 hours to allow the mixture to self-assemble and cross-link the PSZ and DPBZ. FIG. 7 illustrates a representative TEM bright field image of the ordered structure. A lamellar structure was formed, as also confirmed by small-angle X-ray diffraction.

This example, in combination with Example 4, serves to clearly illustrate the effect of a mitigating additive (e.g., TEA) on the size of the domains and complexity of the self-assembled structure.

EXAMPLE 6

Ceramic Composite With Multiple Ordered Structure Regions

In this example, an ordered composite comprising two ceramic compositions was prepared using polysilazane (PSZ) and alkylaminoborazine (AABZ) as the polymeric ceramic precursors, and a polybutadiene-block-polyethylene oxide (PB-b-PEO) as the block copolymer. Polymeric AABZ, as used in this example, was obtained by heating the molecular precursor at 130° C. for 24 h followed by 180° C. for 36 under an inert atmosphere.

PB-b-PEO, PSZ, AABZ, and dicumyl peroxide initiator were dissolved in a 1:1 mixture of tetrahydrofuran and chloroform. The PB-b-PEO had a molecular weight ($M_n$) and polydispersity index ($M_w/M_n$) of 27000 and 1.05, respectively. The dicumyl peroxide was used in an amount of 2 wt % of the PSZ. The dissolved PB-b-PEO, PSZ, AABZ, and dicumyl peroxide initiator had a mass fraction of PSZ of 0.3083, and a mass fraction of AABZ of 0.3083. Once a homogeneous solution was obtained, the solvent was evaporated.

Figure 8A:
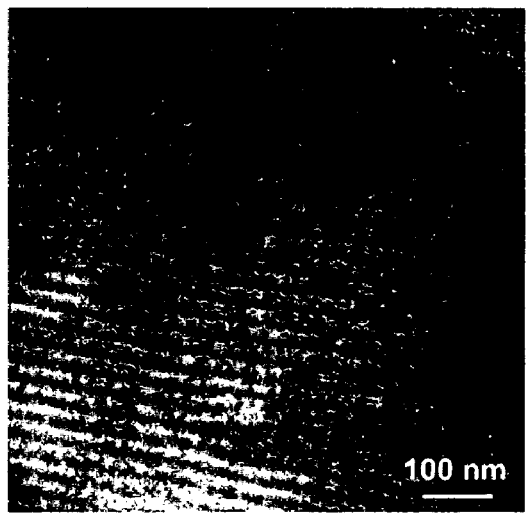
FIG. 8 depicts representative TEM bright field images of an ordered structure produced using polysilazane and alkylaminoborazine as polymeric ceramic precursors and polybutadiene-block-polyethylene oxide as the block copolymer, having both lamellar (a) and cylindrical (b) structures in different regions.
Figure 8B:
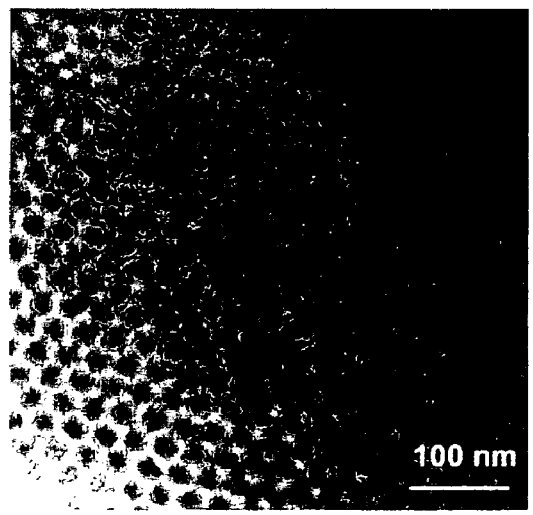

The mixture was annealed at 100° C. for 12 hours to allow the mixture to self-assemble and cross-link the PSZ and AABZ. FIG. 8 illustrates representative TEM bright field images of the ordered structure. A mixture of cylindrical (FIG. 8 (a)) and lamellar (FIG. 8(b)) structures were observed in this self-assembled material.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of forming a nanoscale ceramic composite, the method comprising:
    chemically modifying the polarity of a polymeric ceramic precursor so that it is miscible with and selectively associates toward a block of a block copolymer having blocks of different polarity, and enables the self-assembly of the block copolymer to form an ordered structure, wherein the chemically modified precursor is made incompatible with a block of the block copolymer with which it was compatible prior to being modified;
    mixing the modified polymeric ceramic precursor with a block copolymer to form a mixture; and
    heating the ordered structure for a time and at a temperature effective to form the nanoscale ceramic composite.

2. The method of claim 1, wherein forming the ordered structure from the mixture comprises:
    cross-linking at least a portion of the modified polymeric ceramic precursor.

3. The method of claim 1, wherein the chemical modification comprises adding a functional group to the polymeric ceramic precursor.

4. The method of claim 1, wherein the chemical modification comprises copolymerizing the polymeric ceramic precursor with an other monomer or polymer to form a copolymer comprising the polymeric ceramic precursor.

5. The method of claim 1, wherein the chemical modification comprises functionalizing the polymeric ceramic precursor with a moiety that decomposes to provide a free-radical initiator.

6. The method of claim 1, wherein heating the ordered structure comprises:
    decomposing the block copolymer; and
    ceramizing the polymeric ceramic precursor.

7. The method of claim 1, wherein a temperature of heating the ordered structure is about 500 degrees Celsius to about 1500 degrees Celsius.

8. The method of claim 1, wherein heating the ordered structure occurs in the presence of a gas.

9. The method of claim 1, wherein the polymeric ceramic precursor, prior to modification, is a polysilazane, polycarbosilane, polyborocarbosilane, polyborocarbosilazane, polyborazylene, ring-opened polynorbornene functionalized with decaborane, poly(dipentylaminoborazylene), alkylaminoborazine, or a combination comprising at least one of the forgoing.

10. The method of claim 1, wherein the nanoscale ceramic composite comprises an oxide, carbide, nitride, boride, oxycarbide, oxynitride, carbonitride, or a combination comprising at least one of the foregoing.

11. The method of claim 1, wherein the nanoscale ceramic composite comprises silicon oxide, silicon carbide, silicon nitride, silicon carbonitride, silicon oxynitride, silicon oxycarbonitride, silicon oxycarbide, silicon boron carbonitride, boron nitride, boron carbide, boron carbonitride, hafnium boride, zirconium carbide, zirconium boride, or a combination comprising at least one of the foregoing.

12. The method of claim 1, wherein the nanoscale ceramic composite comprises a lamellar structure, hexagonal structure, cubic structure, perforated lamellar structure, gyroid structure, double gyroid structure, double diamond structure, bicontinuous structure, or a combination comprising at least one of the foregoing structures.

13. The method of claim 1 wherein the ceramic precursor is a polycarbosilane which is chemically modified by:
    reacting the polycarbosilane with an alcohol or an ether in the presence of a tris(pentafluorophenyl) borane catalyst to functionalize at least a portion of the silyl groups.

14. The method of claim 13, wherein the polycarbosilane, prior to reacting, has the structure:

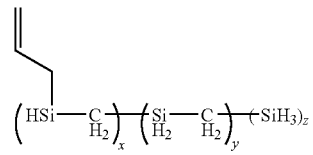

wherein x, y, and z are each independently an integer greater than 1.

15. The method of claim 13, wherein the alcohol is an alkyl-substituted phenol having the structure:

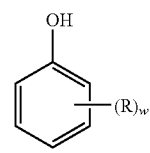

wherein w is an integer from 1 to 3 and wherein R is an alkyl group having 8 to 48 carbon atoms.

16. The method of claim 15, wherein the alkyl-substituted phenol is meta-pentadecylphenol.

17. The method of claim 13, wherein the reacting occurs without any externally applied heat.

18. The method of claim 13, wherein the reacting results in a chemically modified polymeric ceramic precursor having the structure:

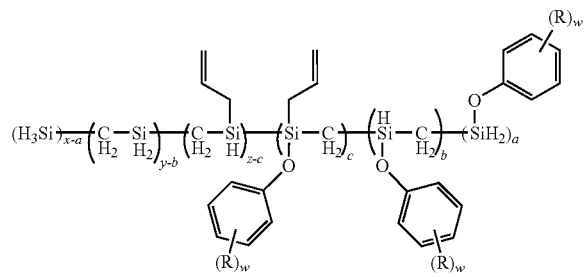

wherein R is an alkyl group having 8 to 48 carbon atoms, wherein x, y, and z are each independently an integer greater than 1, wherein a, b, and c are each independently zero or an integer 1 or greater, provided that at least one of a, b, or c is 1 or greater, wherein a is less than or equal to x, wherein b is less than or equal to y, and wherein c is less than or equal to z.

19. A method of forming a nanoscale ceramic composite, the method comprising:

providing two polymeric ceramic precursors;

providing a block copolymer having blocks of different polarity;

chemically modifying the polarity of at least one of the polymeric ceramic precursors so that it is miscible with and selectively associates toward a block of a block copolymer, and enables the self-assembly of the block copolymer to form an ordered structure, wherein the chemically modified precursor is made incompatible with a block of the block copolymer with which it was compatible prior to being modified;

mixing the polymeric ceramic precursors with a block copolymer;

wherein the two polymeric ceramic precursors enable the self-assembly of the mixture, and wherein mixing the two polymeric ceramic precursors are miscible with and selectively associate toward different types of blocks of the block copolymer;

cross-linking at least a portion of the at least one chemically modified polymeric ceramic precursor to form an ordered structure; and heating the ordered structure for a time and at a temperature effective to form the nanoscale ceramic composite.

20. The method of claim 19, wherein at least one of the two polymeric ceramic precursors, prior to modification, is a polysilazane, polycarbosilane, polyborocarbosilane, polyborocarbosilazane, polyborazylene, ring-opened polynorbornene functionalized with decaborane, poly(dipentylaminoborazylene), alkylaminoborazine, or a combination comprising at least one of the forgoing.

21. The method of claim 19, further comprising cross-linking at least a portion of each of the two polymeric ceramic precursors.

22. The method of claim 19, wherein modifying the at least one polymeric ceramic precursor comprises adding a functional group to the at least one polymeric ceramic precursor, copolymerizing the at least one polymeric ceramic precursor with an other monomer or polymer to form a copolymer comprising the at least one polymeric ceramic precursor, functionalizing the at least one polymeric ceramic precursor with a moiety that decomposes to provide a free-radical initiator, or a combination comprising at least one of the foregoing modifications.

23. The method of claim 19, wherein heating the ordered structure comprises:

decomposing the block copolymer; and ceramizing the two or more polymeric ceramic precursors.

24. The method of claim 19, wherein a temperature of heating the ordered structure is about 500 degrees Celsius to about 1500 degrees Celsius.

25. The method of claim 19, wherein heating the ordered structure occurs in the presence of a gas.

26. The method of claim 19, wherein the nanoscale ceramic composite comprises an oxide, carbide, nitride, boride, oxycarbide, oxynitride, carbonitride, or a combination comprising at least one of the foregoing.

27. The method of claim 19, wherein the nanoscale ceramic composite comprises silicon oxide, silicon carbide, silicon nitride, silicon carbonitride, silicon oxynitride, silicon oxycarbonitride, silicon oxycarbide, silicon boron carbonitride, boron nitride, boron carbide, boron carbonitride, hafnium boride, zirconium carbide, zirconium boride, or a combination comprising at least one of the foregoing.

28. The method of claim 19, wherein the nanoscale ceramic composite comprises a lamellar structure, hexagonal structure, cubic structure, perforated lamellar structure, gyroid structure, double gyroid structure, double diamond structure, bicontinuous structure, or a combination comprising at least one of the foregoing structures.

* * * * *

UNITED STATES PATENT AND TRADEMARK OFFICE
CERTIFICATE OF CORRECTION

PATENT NO. : 7,749,425 B2  Page 1 of 1
APPLICATION NO. : 11/316091
DATED : July 6, 2010
INVENTOR(S) : Malenfant et al.

It is certified that error appears in the above-identified patent and that said Letters Patent is hereby corrected as shown below:

In Column 3, Line 17, delete "terms a" and insert -- terms "a", --, therefor.

In Column 4, Line 6, delete "polynorbomene" and insert -- polynorbornene --, therefor.

In Column 10, Line 62, delete "(Mr)" and insert -- ($M_n$) --, therefor.

In Column 12, Line 9, delete "b/ock" and insert -- block --, therefor.

In Column 15, Line 8, in Claim 19, delete "of a" and insert -- of the --, therefor.

In Column 15, Line 14, in Claim 19, delete "with a" and insert -- with the --, therefor.

In Column 15, Line 17, in Claim 19, after "wherein" delete "mixing".

Signed and Sealed this

Twenty-fourth Day of August, 2010

David J. Kappos
*Director of the United States Patent and Trademark Office*